(12) United States Patent
Johnson et al.

(10) Patent No.: US 8,193,065 B2
(45) Date of Patent: Jun. 5, 2012

(54) ASYMMETRIC SOURCE AND DRAIN STRESSOR REGIONS

(75) Inventors: Jeffrey B. Johnson, Essex Junction, VT (US); Viorel C. Ontalus, Fishkill, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/099,406

(22) Filed: May 3, 2011

(65) Prior Publication Data

US 2011/0212587 A1    Sep. 1, 2011

Related U.S. Application Data

(62) Division of application No. 12/553,627, filed on Sep. 3, 2009, now abandoned.

(51) Int. Cl.
*H01L 21/336* (2006.01)

(52) U.S. Cl. . 438/300; 438/525; 438/595; 257/E21.619; 257/E21.634; 257/E29.268; 257/E21.279; 257/327

(58) Field of Classification Search .......... 438/286, 438/300, 524, 525, 595; 257/288, 327, E21.619, 257/E21.634, E29.268, E29.279
See application file for complete search history.

(56) References Cited

U.S. PATENT DOCUMENTS

| | | | |
|---|---|---|---|
| 6,104,064 A | 8/2000 | Kadosh et al. | |
| 6,815,317 B2 | 11/2004 | Schafbauer et al. | |
| 6,916,716 B1 | 7/2005 | Coad et al. | |
| 7,105,395 B2* | 9/2006 | Burnett et al. | 438/197 |
| 7,144,782 B1 | 12/2006 | Ehrichs | |
| 7,166,897 B2 | 1/2007 | Orlowski et al. | |
| 7,195,983 B2* | 3/2007 | Chindalore et al. | 438/301 |
| 7,288,448 B2 | 10/2007 | Orlowski et al. | |
| 7,354,839 B2 | 4/2008 | Wei et al. | |
| 7,572,706 B2* | 8/2009 | Zhang et al. | 438/302 |
| 7,646,039 B2* | 1/2010 | Zhu et al. | 257/192 |
| 7,883,980 B2* | 2/2011 | Grupp et al. | 438/300 |
| 7,888,221 B2* | 2/2011 | Kavalieros et al. | 438/301 |
| 8,039,341 B2* | 10/2011 | Thean et al. | 438/231 |
| 8,076,189 B2* | 12/2011 | Grant | 438/197 |
| 2003/0205745 A1 | 11/2003 | Nam | |
| 2006/0121711 A1 | 6/2006 | Kelling et al. | |
| 2006/0170016 A1 | 8/2006 | Mathew et al. | |

(Continued)

OTHER PUBLICATIONS

Office Action Communication date mailed Dec. 13, 2010, U.S. Appl. No. 12/553,627, filed Sep. 3, 2009, pp. 1-8.

(Continued)

*Primary Examiner* — Mary Wilczewski
(74) *Attorney, Agent, or Firm* — Gibb I.P. Law Firm, LLC; David A. Cain, Esq.

(57) ABSTRACT

A method forms a structure has a substrate having at least one semiconductor channel region, a gate dielectric on the upper surface of the substrate over the semiconductor channel region, and a gate conductor on the gate dielectric. Asymmetric sidewall spacers are located on the sidewalls of the gate conductor and asymmetric source and drain regions are located within the substrate adjacent the semiconductor channel region. One source/drain region is positioned closer to the midpoint of the gate conductor than is the other source/drain region. The source and drain regions comprise a material that induces physical stress upon the semiconductor channel region.

5 Claims, 12 Drawing Sheets

U.S. PATENT DOCUMENTS

| | | | |
|---|---|---|---|
| 2006/0194381 A1 | 8/2006 | Wei et al. | |
| 2007/0026591 A1* | 2/2007 | Grupp et al. | 438/194 |
| 2007/0057287 A1 | 3/2007 | Lin et al. | |
| 2007/0132038 A1 | 6/2007 | Chong et al. | |
| 2007/0138570 A1 | 6/2007 | Chong et al. | |
| 2007/0173022 A1 | 7/2007 | Wang et al. | |
| 2007/0235802 A1 | 10/2007 | Chong et al. | |
| 2008/0006818 A1 | 1/2008 | Luo et al. | |
| 2008/0185662 A1 | 8/2008 | Yang | |
| 2008/0233691 A1 | 9/2008 | Cheng et al. | |
| 2008/0290422 A1 | 11/2008 | Nowak | |
| 2008/0311720 A1* | 12/2008 | Hoffman et al. | 438/300 |
| 2009/0011569 A1 | 1/2009 | Lin et al. | |
| 2009/0020830 A1 | 1/2009 | Anderson et al. | |
| 2009/0032841 A1* | 2/2009 | Eller et al. | 257/190 |
| 2009/0032845 A1* | 2/2009 | Zhu et al. | 257/192 |
| 2010/0025744 A1 | 2/2010 | Miyashita et al. | |

OTHER PUBLICATIONS

Office Action Communication date mailed Feb. 3, 2011, U.S. Appl. No. 12/553,627, filed Sep. 3, 2009, pp. 1-5.

Chen, et al., "Modeling and Analysis of the Asymmetric Source/Drain Extension CMOS Transistors for Nanoscale Technologies," IEEE Transactions on Electron Devices, vol. 55, No. 4, Apr. 2008, pp. 1005-1012.

Buller, et al., "Opportunities and Challenges in Asymmetric Device Implementation," IEEE 2004 Custom Integrated Circuits Conference, vol. 11, No. 3, 2004, pp. 229-232.

Ghani, et al., "Asymmetric Source/Drain Extension Transistor Structure for High Performance Sub-50nm Gate Length CMOS Devices," 2001 Symposium on VLSI Technology Digest of Technical Papers, 3A-1, pp. 17-18.

* cited by examiner

ASYMMETRIC SOURCE AND DRAIN STRESSOR REGIONS

CROSS-REFERENCE TO RELATED APPLICATIONS

This application is a divisional of U.S. application Ser. No. 12/553,627 filed Sep. 3, 2009, the complete disclosure of which, in its entirety, is herein incorporated by reference.

BACKGROUND

1. Field of the Invention

The embodiments herein generally relate to integrated circuit structures and, more specifically to transistor structures that include asymmetric stressing structures within source and drain regions of the transistor.

2. Description of the Related Art

Many recent advances have been achieved within integrated circuit transistors by forming the transistors to be asymmetric. For example, two recent U.S. Patent Publications 2009/0020830 entitled Asymmetric Field Effect Transistor Structure And Method and 2008/0290422 entitled Asymmetric Field Effect Transistors (FETs) (both of which are incorporated herein by reference) disclose numerous advantages for making transistors asymmetric in design. For example, with asymmetric transistors, both series resistance in the source region and gate to drain capacitance are reduced in order to provide optimal performance (i.e., to provide improved drive current with minimal circuit delay). Specifically, different heights of the source and drain regions and/or different distances between the source and drain regions and the gate can be tailored to minimize series resistance in the source region (i.e., in order to ensure that series resistance is less than a predetermined resistance value) and to simultaneously minimize gate to drain capacitance (i.e., in order to simultaneously ensure that gate to drain capacitance is less than a predetermined capacitance value).

The embodiments disclosed below provide different methods and structures that provide additional benefits of asymmetric transistors.

SUMMARY

One method embodiment herein deposits impurities into a substrate to form at least one semiconductor channel region bordered by shallow trench isolation regions below the upper surface of the substrate. The method forms a gate dielectric on the upper surface of the substrate over the semiconductor channel region and patterns a gate conductor on the gate dielectric over the semiconductor channel region. The gate conductor has sidewalls.

The method forms asymmetric sidewall spacers on the sidewalls of the gate conductor. One method to achieve the asymmetric sidewall spacers is to form normal sidewall spacers and then perform an angled implant into the sidewall spacers that implants a different amount of implanted material into a first sidewall spacer on a first sidewall of the gate conductor relative to a second sidewall spacer on a second sidewall of the gate conductor. The method then etches the sidewall spacers. The different amount of the implanted material within the first sidewall spacer relative to the second sidewall spacer causes the first sidewall spacer to be etched at a different rate than the second sidewall spacer, making the sidewall spacers asymmetric sidewall spacers.

While the above describes a specific embodiment, one ordinarily skilled in the art would understand that this applies to any method to make asymmetric sidewall spacers. Disclosed herein are methods to create a sidewall on one side that is etched at a faster etch rate, and methods to harden the material on one side to make it slower to etch, which will result in a differential spacer post etching. Hardening on one side can be done for example by exposing one side to UV (ultraviolet) cure or adding certain dopants.

The method patterns trenches within the semiconductor channel region using the asymmetric sidewall spacers as alignment guides to form asymmetric trenches within the semiconductor channel region (asymmetric relative to the gate conductor). This patterning of the trenches can form the trenches to have different sizes. The resulting trenches are asymmetric. Also, one trench is positioned closer to the midpoint of the gate conductor than is the other trench.

The method epitaxially grows source and drain regions within the asymmetric trenches. The epitaxially growing of the source and drain regions forms the source and drain regions to have different sizes. One source/drain region is positioned closer to the midpoint of the gate conductor than is the other source/drain region. The source and drain regions comprise a material (e.g., silicon carbon, silicon germanium, etc.) that induces physical stress upon the semiconductor channel region (e.g., compressive stress or tensile stress upon the semiconductor channel region). Source and drain regions have the doping levels required for the device to function properly.

This process produces a structure that has a substrate having at least one semiconductor channel region, a gate dielectric on the upper surface of the substrate over the semiconductor channel region, and a gate conductor on the gate dielectric. Asymmetric sidewall spacers are located on the sidewalls of the gate conductor and asymmetric source and drain regions are located within the substrate adjacent the semiconductor channel region. The source and drain regions are positioned within asymmetric trenches within the semiconductor channel region and can have different sizes. One source/drain region can be positioned closer to the midpoint of the gate conductor than is the other source/drain region.

The source and drain regions comprise a material (e.g., silicon carbon, silicon germanium, etc.) that induces physical stress (e.g., compressive stress or tensile stress) upon the semiconductor channel region. Shallow trench isolation regions are located adjacent the asymmetric source and drain regions. It is also to be understood that the method described here produces an asymmetric doping of source/drain regions.

Another method embodiment herein similarly deposits impurities into a substrate to form at least one semiconductor channel region bordered by shallow trench isolation regions below the upper surface of the substrate, forms a gate dielectric on the upper surface of the substrate over the semiconductor channel region, and patterns a gate conductor on the gate dielectric over the semiconductor channel region.

However, rather than forming asymmetric sidewall spacers, this embodiment patterns trenches within the semiconductor channel region using the gate conductor or gate conductor spacer sidewalls as an alignment guide. The trenches have exterior trench sidewalls adjacent the shallow trench isolation regions. Then, this embodiment performs operations to result in an asymmetric trench by changing the RIE (reactive ion etching) or etch properties on one side of the trench. In one embodiment an angled implant that implants a different amount of implanted material into a first interior trench sidewall on a first side of the gate conductor relative to a second interior trench sidewall on a second side of the gate conductor (that is opposite the first side of the gate conductor) is performed.

While the above describes a specific embodiment, one ordinarily skilled in the art would understand that this applies to any method to make an asymmetric sidewall spacer in the trench. Disclosed herein are methods to create a sidewall on one side that is etched at a faster etch rate, and methods to harden the material on one side to make it slower to etch, which will result in an asymmetric trench post etching. Hardening on one side can be done for example by exposing one side to UV (ultraviolet) cure, adding certain dopants.

The method then performs a material removal process (e.g., ammonia etching, etc.) that removes material from the first interior trench sidewall at a different rate relative to the second interior trench sidewall. This difference in etching rate occurs because of the different amount of implanted material that is implanted into the first interior trench sidewall relative to the second interior trench sidewall. One trench is positioned closer to the midpoint of the gate conductor than is the other trench. Therefore, the trenches comprise asymmetric trenches with respect to the gate conductor.

Similarly to the previous embodiment, this embodiment also epitaxially grows source and drain regions within the asymmetric trenches. Thus, one source/drain region is positioned closer to the midpoint of the gate conductor than is the other source/drain region. Again, the source and drain regions comprise material (silicon carbon, silicon germanium, etc.) that induces physical stress (compressive stress or tensile stress) upon the semiconductor channel region.

This method embodiment produces a structure that similarly has a substrate having at least one semiconductor channel region, a gate dielectric on the upper surface of the substrate over the semiconductor channel region, and a gate conductor on the gate dielectric. However, this embodiment does not have the previously discussed asymmetric sidewall spacers, but retains the asymmetric source and drain regions within the substrate adjacent the semiconductor channel region. These source and drain regions are positioned within asymmetric trenches within the semiconductor channel region and the source and drain regions in this embodiment have the same size. One source/drain region is positioned closer to the midpoint of the gate conductor than is the other source/drain region. The source and drain regions comprise an epitaxial material that induces physical stress upon the semiconductor channel region. Further, shallow trench isolation regions are located adjacent the asymmetric source and drain regions. Source/Drain are doped according to the transistor type, N-type for NFET and P-type for PFET.

Yet, another method embodiment herein similarly deposits impurities into a substrate to form at least one semiconductor channel region bordered by shallow trench isolation regions below the upper surface of the substrate, forms a gate dielectric on the upper surface of the substrate over the semiconductor channel region, and patterns a gate conductor on the gate dielectric over the semiconductor channel region. However, rather than forming asymmetric sidewall spacers, this embodiment patterns trenches within the semiconductor channel region using the gate conductor or gate conductor spacer sidewalls as an alignment guide.

This embodiment performs operations to result into an asymmetric trench by protecting one side of the trench, source or drain with a film or mask and etching further the unprotected/unmasked side. The resulting structure has trenches that are asymmetric with respect to the middle of the transistor gate.

Similarly to the previous embodiments, this embodiment also epitaxially grows source and drain regions within the asymmetric trenches. Thus, one source/drain region is positioned closer to the midpoint of the gate conductor than is the other source/drain region. Again, the source and drain regions comprise material (silicon carbon, silicon germanium, etc.) that induces physical stress (compressive stress or tensile stress) upon the semiconductor channel region.

BRIEF DESCRIPTION OF THE DRAWINGS

The disclosed embodiments will be better understood from the following detailed description with reference to the drawings, which are not necessarily drawing to scale and in which.

DETAILED DESCRIPTION

The embodiments of the invention and the various features and advantageous details thereof are explained more fully with reference to the non-limiting embodiments that are illustrated in the accompanying drawings and detailed in the following description.

As mentioned above, various advantages can be achieved through the utilization of an asymmetric transistor structure. The term asymmetric, as used herein, means that two or more items do not have the same size, shape, doping and/or relative position to a given point. This disclosure presents numerous embodiments that utilize straining or stressing materials within source and drain regions that are asymmetric with respect to the gate conductor of the transistor. These asymmetric source and drain stressing regions are epitaxially grown within asymmetric trenches. These methods and structures allow the embodiments herein to impart unique straining characteristics on the channel region that were not available previously.

Figure 1:
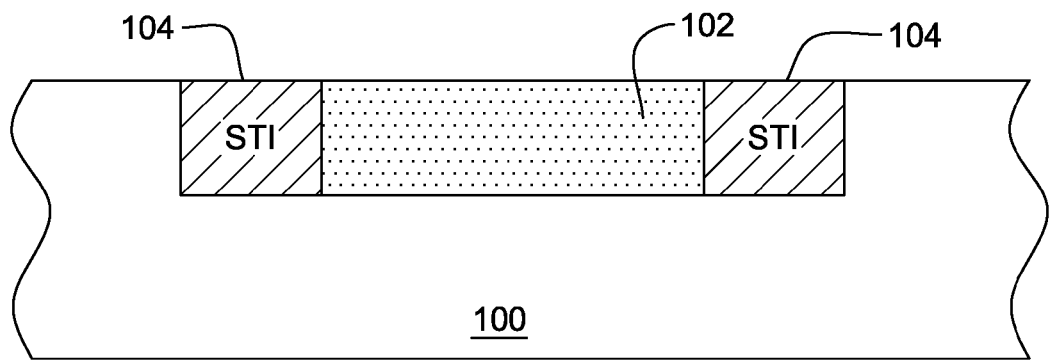
FIG. 1 is a schematic cross-sectional diagram of an integrated circuit structure according to embodiments herein.

Referring to FIGS. 1-8, one embodiment herein begins (as shown in item 200 in FIG. 8) by depositing or implanting impurities into a substrate 100 (such as a silicon or silicon-based substrate) to form at least one semiconductor channel region 102 bordered by shallow trench isolation regions 104 below the upper surface of the substrate 100, as shown in FIG. 1. The substrate can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures etc. The impurities can comprises any positive-type impurity (P-type impurity, e.g., phosphorus (P), arsenic (As), antimony (Sb) etc.) or any negative-type impurity (N-type impurity, e.g., boron, indium, etc.). The implantation processes mentioned herein can take any appropriate form (whether now known or developed in the future) and can comprise, for example, ion implantation, etc. Also, see U.S. Pat. No. 6,815,317 (incorporated herein by reference) for a full discussion of implantation techniques. Shallow trench isolation (STI) structures are well-known to those ordinarily skilled in the art and are generally formed by patterning openings within the substrate and growing or filling the openings with a highly insulating material.

Figure 2:
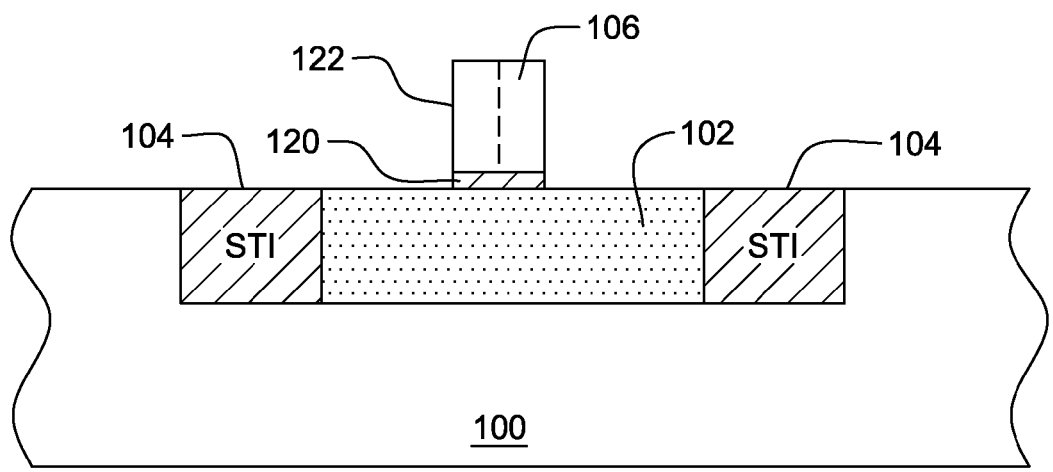
FIG. 2 is a schematic cross-sectional diagram of an integrated circuit structure according to embodiments herein.
Figure 8:
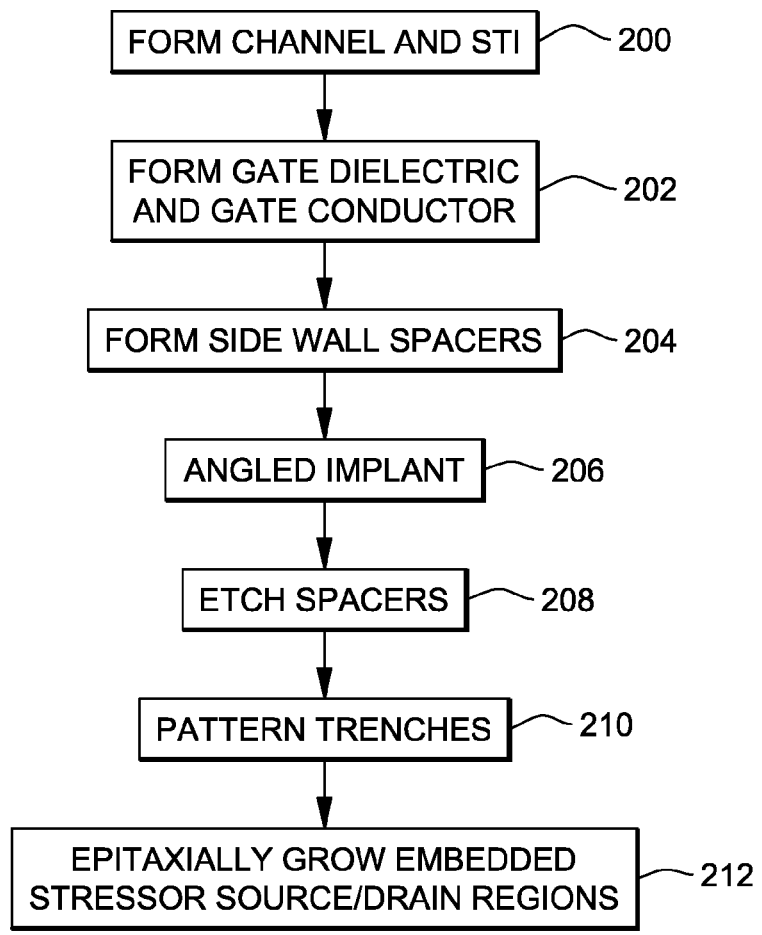
FIG. 8 is a flow diagram illustrating a method embodiment herein.

In item 202 in FIG. 8, the method forms a gate dielectric 120 on the upper surface of the substrate 100 over the semiconductor channel region 102 and patterns a gate conductor 122 on the gate dielectric 120 over the semiconductor channel region 102, as shown in FIG. 2. The midline or midpoint of the gate conductor is shown as item 106

The dielectrics (insulators) mentioned herein can, for example, be grown from either a dry oxygen ambient or steam and then patterned. The thickness of dielectrics herein may vary contingent upon the required device performance. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, metal oxides like tantalum oxide, etc.

As shown, the gate conductor 122 has sidewalls. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, and may be deposited using physical vapor deposition, chemical vapor deposition, or any other technique known in the art.

Figure 3:
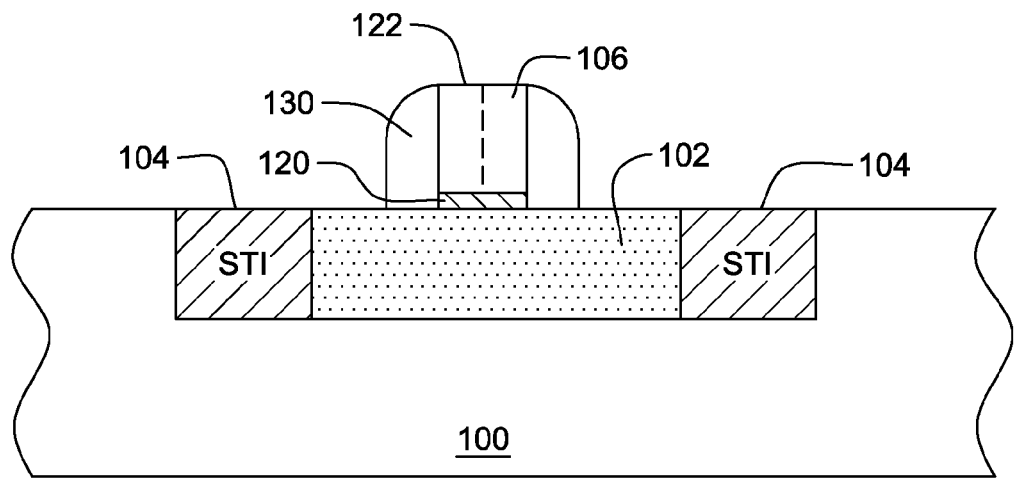
FIG. 3 is a schematic cross-sectional diagram of an integrated circuit structure according to embodiments herein.
Figure 4:
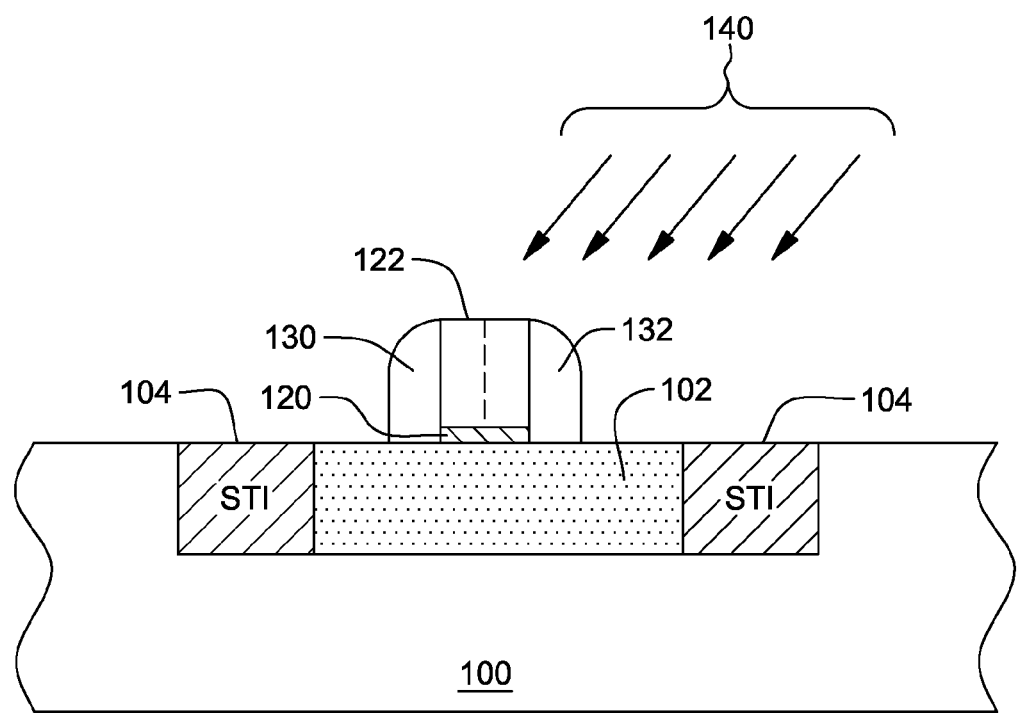
FIG. 4 is a schematic cross-sectional diagram of an integrated circuit structure according to embodiments herein.

As shown in item 204 in FIG. 8, the method forms sidewall spacers 130, 132 on the sidewalls of the gate conductor 122 (FIG. 3). Sidewall spacers are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

In item 206 in FIG. 8, the method then performs an angled implant 140 into the sidewall spacers 130, 132 that implants a different amount of implanted material (e.g., xenon, germanium, etc.) into the first sidewall spacer 130 on a first sidewall of the gate conductor 122 relative to a second sidewall spacer 132 on a second sidewall of the gate conductor 122.

In item 208 in FIG. 8, the method then etches the sidewall spacers 130, 132. The various etching and material removal processes mentioned herein can comprise, for example, dry etching with a plasma of reactive gases such as fluorocarbons, oxygen, chlorine, boron trichloride; sometimes with addition of nitrogen, argon, helium and other gases; or wet etching (e.g., a buffered oxide etch, also known as buffered HF or BHF, using a mixture of a buffering agent, such as ammonium fluoride ($NH_4F$), and hydrofluoric acid (HF).

Figure 5:
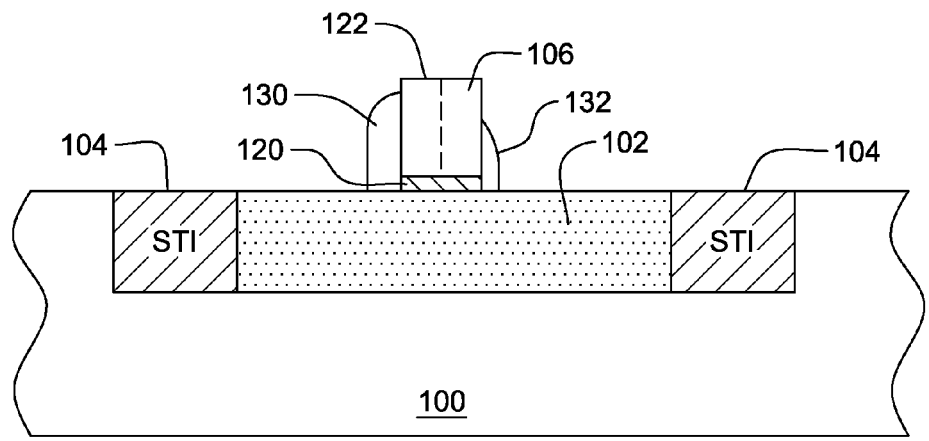
FIG. 5 is a schematic cross-sectional diagram of an integrated circuit structure according to embodiments herein.
Figure 6:
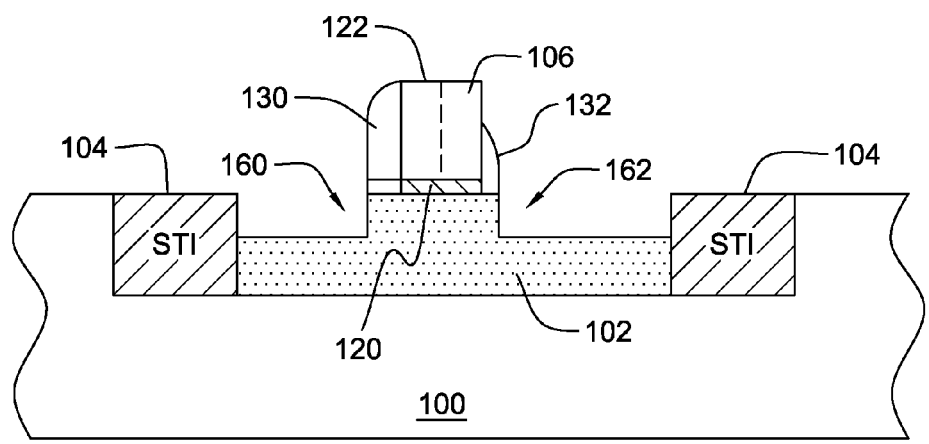
FIG. 6 is a schematic cross-sectional diagram of an integrated circuit structure according to embodiments herein.

As shown in FIG. 5, the different amount of implanted material within the first sidewall spacer 130 relative to the second sidewall spacer 132 causes the first sidewall spacer 130 to be etched at a different rate than the second sidewall spacer 132 making the sidewall spacers 130, 132 different in size and therefore "asymmetric" sidewall spacers. While one methodology for forming asymmetric sidewall spacers is disclosed herein, those ordinarily skilled in the art would understand that different processes could be utilized to form such sidewall spacers (for example, see U.S. Patent Publications 2006/0121711 and 2008/0185662 (incorporated herein by reference) that are directed toward methods for forming asymmetric spacer structures for a semiconductor device).

In item 210 in FIG. 8, the method then patterns trenches 160, 162 within the semiconductor channel region 102 using the asymmetric sidewall spacers 130, 132 as alignment guides to form asymmetric trenches 160, 162 within the semiconductor channel region 102 (asymmetric relative to the gate conductor 122) using any of the previously mentioned etching processes. This patterning forms the trenches 160, 162 to have different sizes. One of the trenches 162 is positioned closer to the middle of the gate 122 and the other trench 160 is positioned at a longer distance from the middle of the gate conductor 122. Thus, one trench is positioned closer to the midpoint of the gate conductor 106 than is the other trench.

Figure 7:
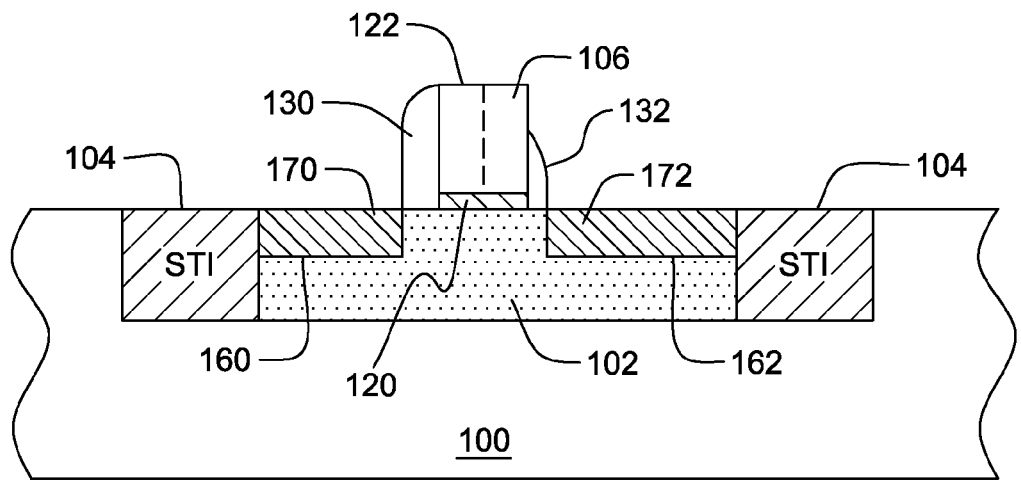
FIG. 7 is a schematic cross-sectional diagram of an integrated circuit structure according to embodiments herein.

As shown in item 212 in FIG. 8, the method then epitaxially grows source and drain regions 170, 172 within the asymmetric trenches 160, 162 (FIG. 7). The epitaxial growth processes herein can, for example, use vapor-phase epitaxy (VPE); molecular-beam, or liquid-phase epitaxy (MBE or LPE), etc. or any other epitaxial processing. The epitaxially growing of the source and drain regions 170, 172 forms the source and drain regions 170, 172 to have different sizes. One region 172 of the source and drain regions 170, 172 is positioned closer to the midpoint of the gate conductor 122 than the other region 170 (of the source and drain regions 170, 172).

The source and drain regions 170, 172 comprise a material (e.g., silicon carbon, silicon germanium, etc.) that induces physical stress upon the semiconductor channel region 102 (e.g., compressive stress or tensile stress upon the semiconductor channel region 102). The concept of source and drain stressor regions is previously known to those ordinarily skilled in the art. For example, U.S. Patent Publications 2007/0132038, 2007/0138570, 2007/0235802, and 2008/0006818 (incorporated herein by reference) provide many details regarding symmetric source and drain stressor structures and methods.

As shown in FIG. 7, this process produces a structure that has a substrate 100 having at least one semiconductor channel region 102, a gate dielectric 120 on the upper surface of the substrate 100 over the semiconductor channel region 102, and a gate conductor 122 on the gate dielectric 120. Asymmetric sidewall spacers 130, 132 are located on the sidewalls of the gate conductor 122 and asymmetric source and drain regions 170, 172 are located within the substrate 100 adjacent the semiconductor channel region 102. The source and drain regions 170, 172 are positioned within asymmetric trenches 160, 162 within the semiconductor channel region 102 and have different sizes. One region of the source and drain regions 170, 172 is positioned closer to the midpoint of the gate conductor 106 than is the other source/drain region 170, 172.

The source and drain regions 170, 172 comprises a material (e.g., silicon carbon, silicon germanium, etc.) that places physical stress (e.g., compressive stress or tensile stress) upon the semiconductor channel region 102. Shallow trench isolation regions 104 are located adjacent the asymmetric source and drain regions 170, 172. Additional spacers, additional doping implants (halos, extension, conductive dopings, etc.) conductive contacts, silicides, insulating layers, etc., can be added to the structures herein, depending upon the ultimate final transistor design goals. The epitaxial stressors can be grown in-situ doped or can be doped after the epitaxy is complete.

As shown in FIGS. 9-13, another method embodiment herein similarly deposits impurities into a substrate 100 to form at least one semiconductor channel region 102 bordered by shallow trench isolation regions 104 below the upper surface of the substrate 100, forms a gate dielectric 120 on the upper surface of the substrate 100 over the semiconductor channel region 102, and patterns a gate conductor 122 on the gate dielectric 120 over the semiconductor channel region 102 to similarly produce the structure shown in FIG. 2 that is discussed above. These processing steps are also illustrated in items 400 and 402 in FIG. 13.

Figure 9:
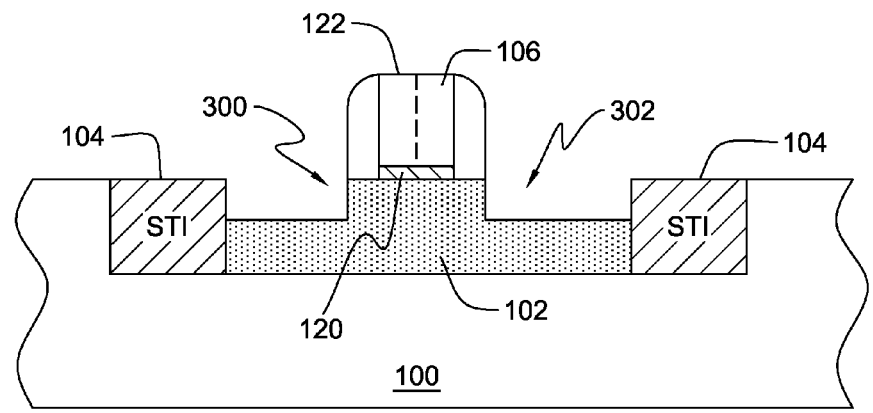
FIG. 9 is a schematic cross-sectional diagram of an integrated circuit structure according to embodiments herein.

However, rather than forming asymmetric sidewall spacers 130, 132, as is done in the previous embodiment, this embodiment patterns trenches 300, 302 within the semiconductor channel region 102 using the gate conductor 122, or gate sidewall spacers as an alignment guide as shown in FIG. 9. This is also illustrated in item 404 in FIG. 13. At this point in the processing, the trenches 300, 302 are identical and are not asymmetric. Each of the trenches 300, 302 have "interior" trench sidewalls immediately below the gate conductor 122 or below the gate sidewall spacers and "exterior" trench sidewalls adjacent the shallow trench isolation regions 104.

Figure 10:
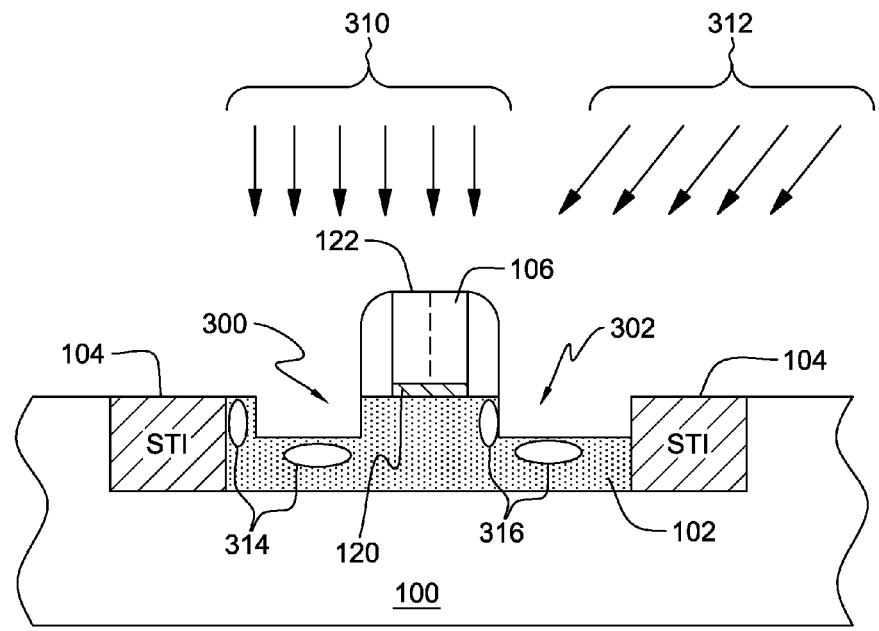
FIG. 10 is a schematic cross-sectional diagram of an integrated circuit structure according to embodiments herein.
Figure 13:
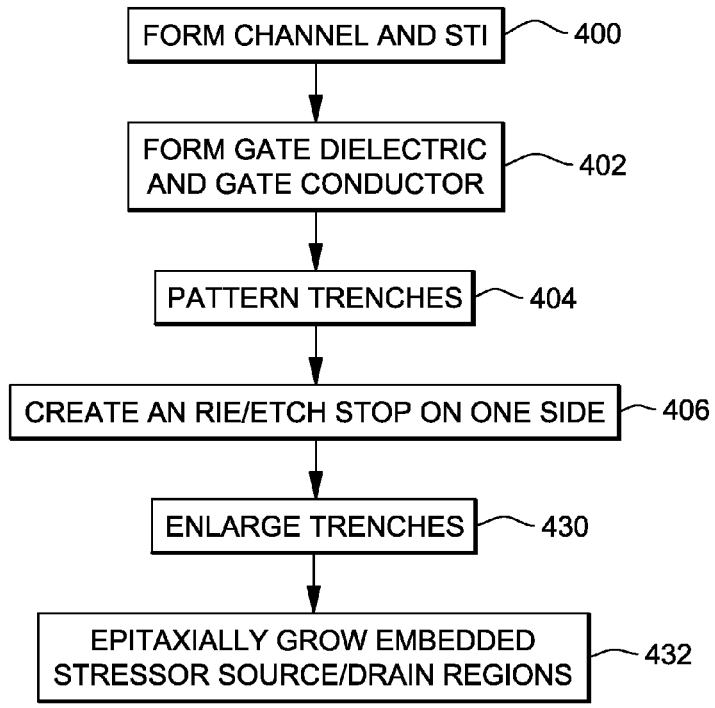
FIG. 13 is a flow diagram illustrating a method embodiment herein.

As shown in item 406 in FIG. 13, this embodiment then creates differential etch or RIE properties between the two trenches 300, 302. While this can be created in many ways, in one example this is done performing at least an angled implant 312 (and can implant a perpendicular implant 310) that implants a different amount of implanted material into a first interior trench sidewall on a first side of the gate conductor 122 relative to a second interior trench sidewall on a second side of the gate conductor 122 (that is opposite the first side of the gate conductor 122). The implanted material 310, 312 can comprise any of the impurities discussed above. This creates implant regions 314 and 316 as shown in FIG. 10. More specifically, implant regions 314 are positioned along the bottom and the exterior trench sidewall of trench 300. To the contrary, the implant regions 316 are positioned along the bottom and the interior trench sidewall of trench 302. Therefore the interior trench sidewall of trench 300 does not have sufficient quantities (and potentially does not have any) of the implanted impurity (310, 312); however the interior trench sidewall of trench 302 has a relatively larger amount of the impurities (310, 312).

Figure 11:
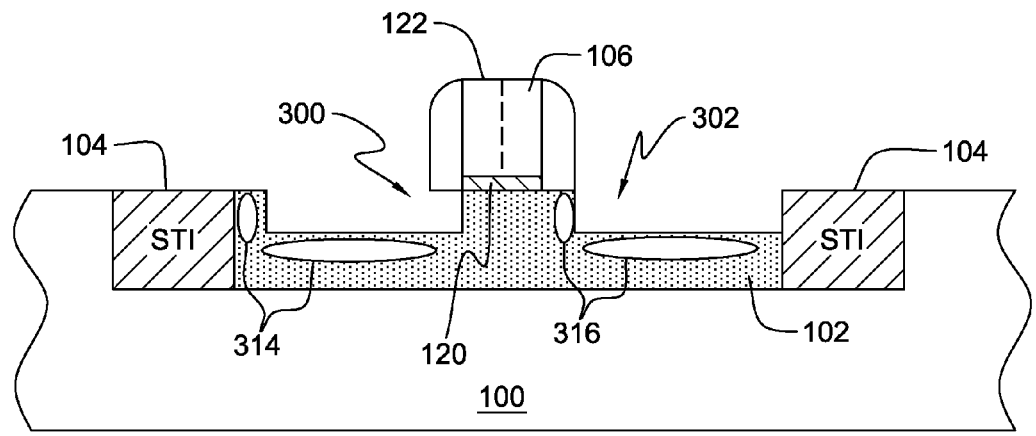
FIG. 11 is a schematic cross-sectional diagram of an integrated circuit structure according to embodiments herein.

As shown in item 430 and FIG. 13, the method then enlarges the sizes of the trenches 300, 302 by performing a material removal process (e.g., any of the material removal processes discussed above, such as ammonia etching, etc.) that removes material from the areas of the trenches that have not been modified by the implant regions 314, 316 (FIG. 11). This material removal process attacks the first interior trench sidewall of trench 300 at a different rate (higher rate) relative to the second interior trench sidewall of trench 302. This difference in etching rate occurs because of the different amount of implanted material that is implanted into the first interior trench sidewall (relatively none) relative to the second interior trench sidewall (relatively large amount 316). While this is an example where the etch properties of the sidewall trenches are modified by an implant, one ordinarily skilled in the art would understand that this applies to any method to make a sidewall trench with asymmetric etch or RIE properties resulting in an asymmetric trench. Specific radiation treatment, a chemical cure or thermal treatment can achieve similar results.

As shown in FIG. 11 as a result of this material removal process, one of the trenches 300 is enlarged to be positioned closer to the middle 106 of the gate 122. Thus, one trench is positioned closer to the midpoint of the gate conductor 106 than is the other trench. Therefore, after the material removal process of item 430, the trenches 300, 302 comprise asymmetric trenches with respect to the gate conductor 122; however, because the trenches 300, 302 were evenly affected by the material removal processing 430, this material removal processing 430 forms the trenches 300, 302 to have the same size (they are merely asymmetric with respect to the position of the gate conductor 122).

Figure 12:
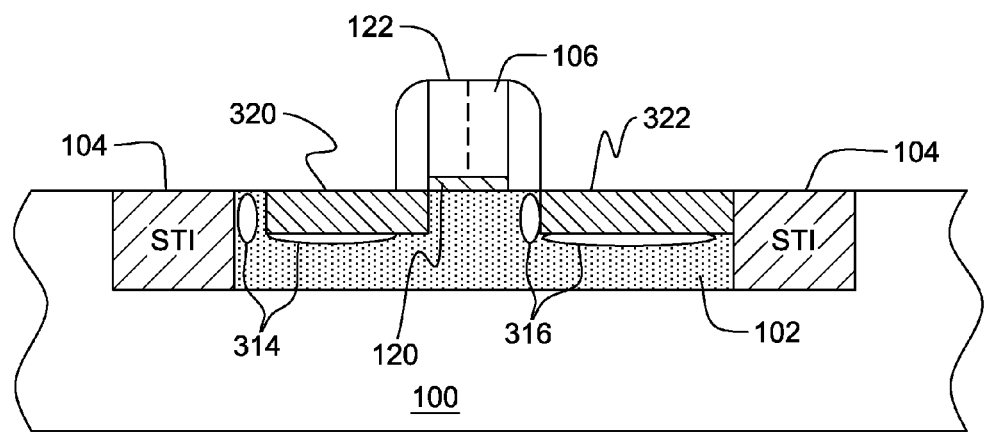
FIG. 12 is a schematic cross-sectional diagram of an integrated circuit structure according to embodiments herein.

As shown in item 432 in FIG. 13 and in FIG. 12, similarly to the previous embodiment, this embodiment also epitaxially grows source and drain regions 320, 322 within the asymmetric trenches, such that one region 320 of the source and drain regions 320, 322 is positioned closer to the midpoint of the gate conductor 106 than is the other source/drain region. Again, the source and drain regions 320, 322 comprise a material (silicon carbon, silicon germanium, etc.) that applies physical stress (compressive stress or tensile stress) upon the semiconductor channel region 102.

This method embodiment produces a structure (shown in FIG. 12) that similarly has a substrate 100 having at least one semiconductor channel region 102, a gate dielectric 120 on the upper surface of the substrate 100 over the semiconductor channel region 102, and a gate conductor 122 on the gate dielectric 120. However, this embodiment does not have the previously discussed asymmetric sidewall spacers 130, 132, but retains the asymmetric source and drain regions 320, 322 within the substrate 100 adjacent the semiconductor channel region 102. These source and drain regions 320, 322 are positioned within asymmetric trenches within the semiconductor channel region 102 and the source and drain regions 320, 322 in this embodiment have the same size. Again, one region 320 of the source and drain regions 320, 322 is positioned closer to the midpoint of the gate conductor 106 than is the other source/drain region. The source and drain regions 320, 322 comprise an epitaxial material that induces physical stress upon the semiconductor channel region 102. Further, shallow trench isolation regions 104 are located adjacent the asymmetric source and drain regions 320, 322.

Figure 14:
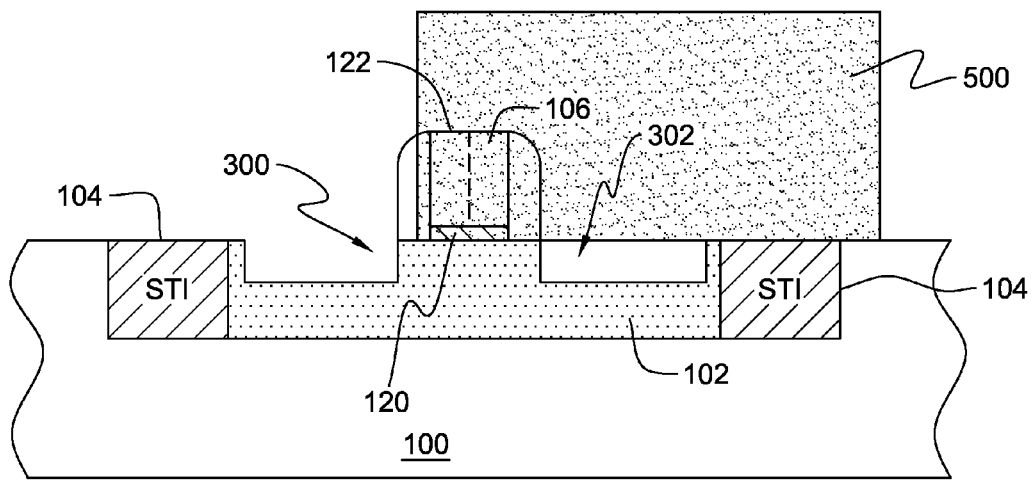
FIG. 14 is a schematic cross-sectional diagram of an integrated circuit structure according to embodiments herein.
Figure 15:
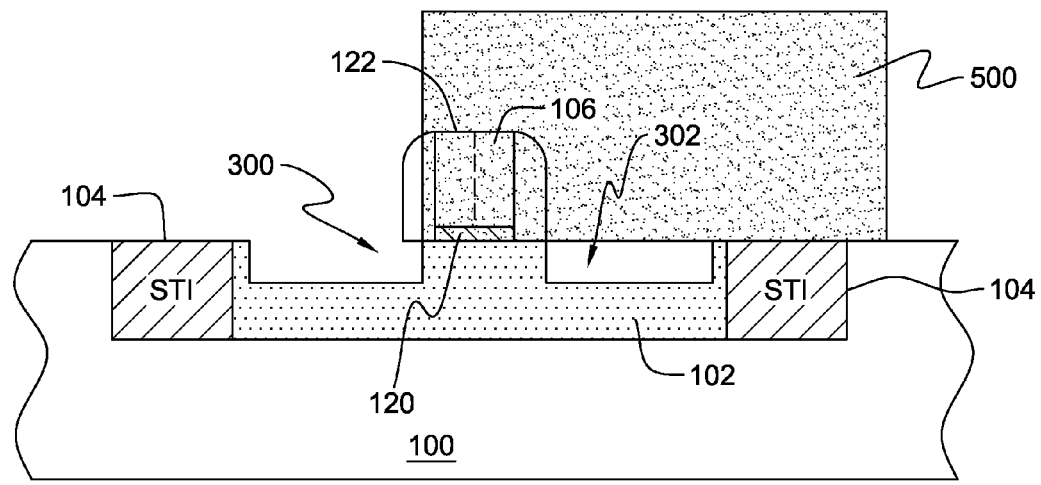
FIG. 15 is a schematic cross-sectional diagram of an integrated circuit structure according to embodiments herein.
Figure 16:
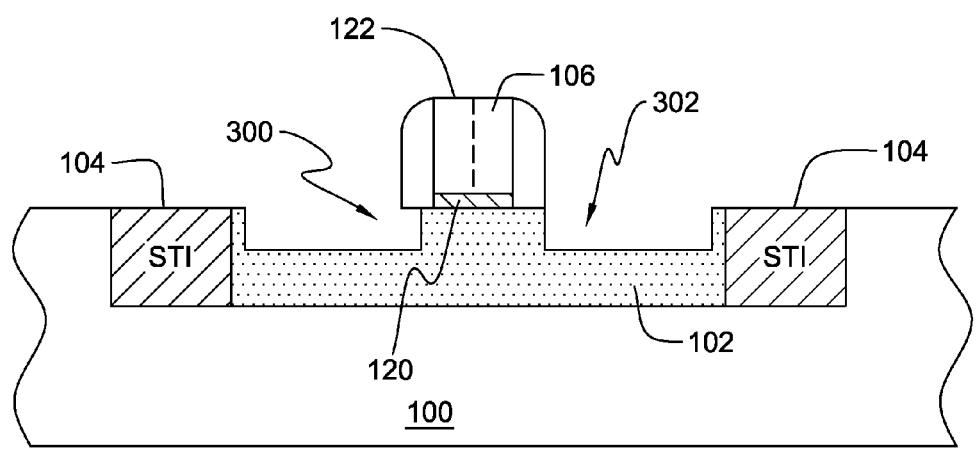
FIG. 16 is a schematic cross-sectional diagram of an integrated circuit structure according to embodiments herein.
Figure 17:
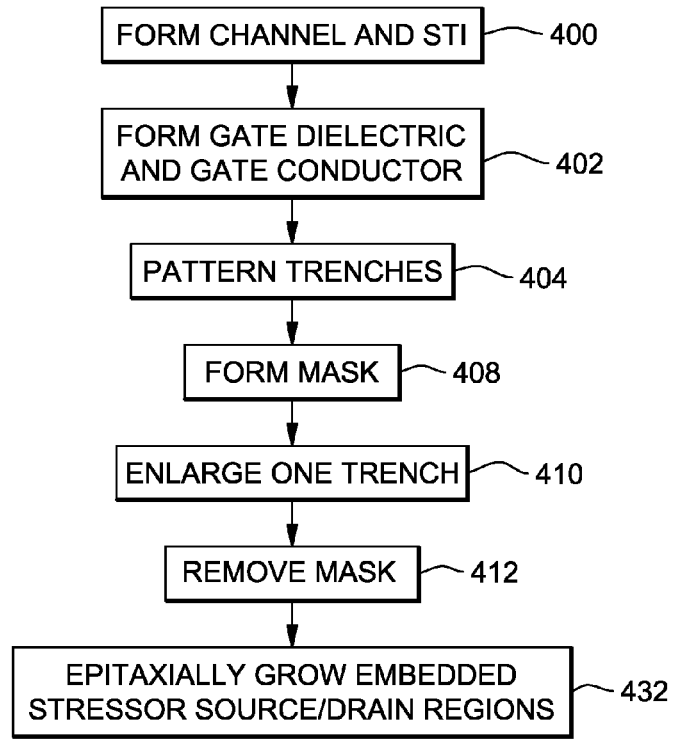
FIG. 17 is a flow diagram illustrating a method embodiment herein.

FIGS. 14-17 illustrate an alternative embodiment that begins with the structure illustrated in FIG. 9 (discussed above). As shown in FIG. 14, the structure in FIG. 9 is altered by patterning a mask 500 (such as a common organic photoresist mask) over one-half of the structure. This leaves one of the trenches protected (302) and exposes the other trench (300) and is shown as item 408 in FIG. 17. Note that FIG. 17 is similar to FIG. 13 except for items 408, 410, and 412, and a redundant discretion of the other items (which are discussed fully above) is avoided here. The exposed trench 300 can then be etched to be asymmetric to the other trench 302 as shown in FIG. 15 an item 410 in FIG. 17. The mask 500 can then be removed as shown in FIG. 16 and in item 412 in FIG. 17 and the epitaxial stressor source and drain regions can be grown (as shown in FIGS. 7 and 12 and item and 432, discussed above).

Figure 18:
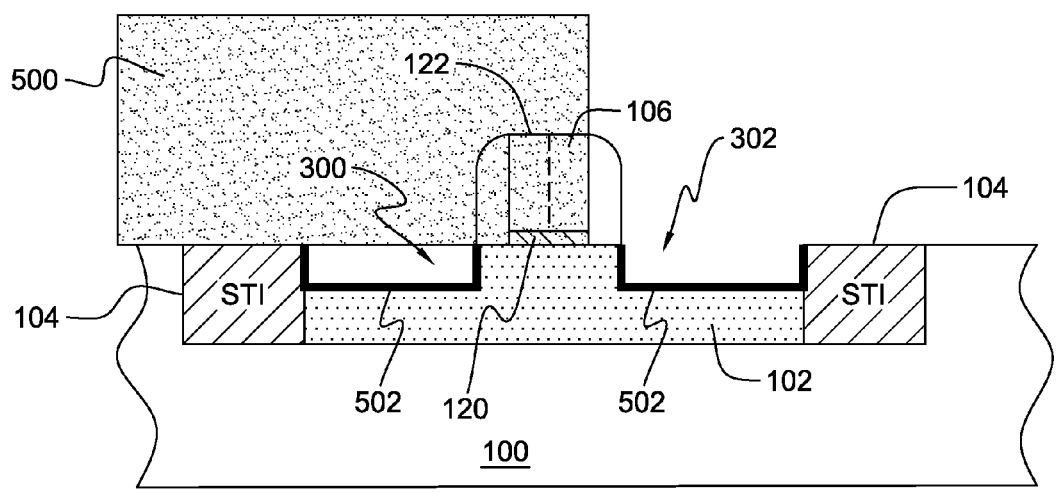
FIG. 18 is a schematic cross-sectional diagram of an integrated circuit structure according to embodiments herein.
Figure 19:
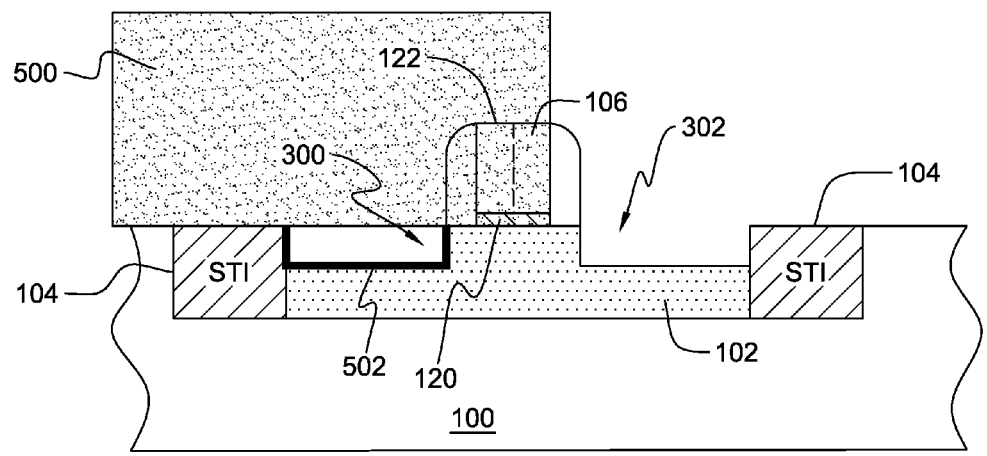
FIG. 19 is a schematic cross-sectional diagram of an integrated circuit structure according to embodiments herein.
Figure 20:
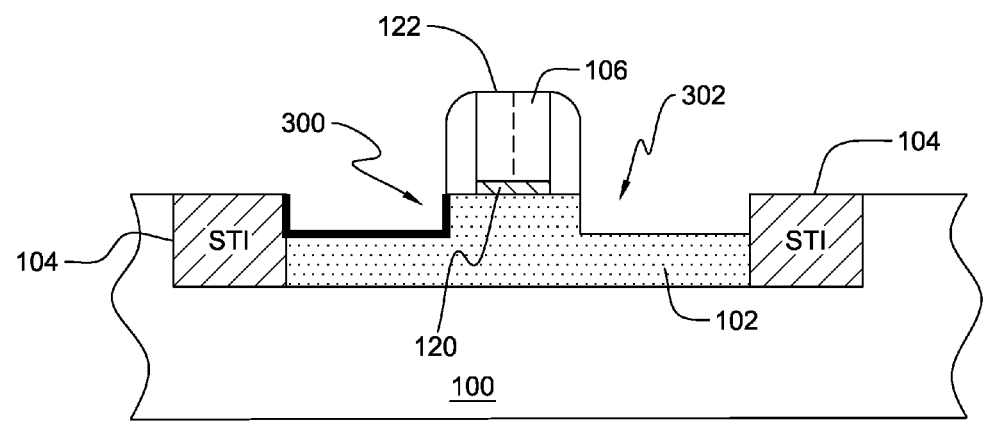
FIG. 20 is a schematic cross-sectional diagram of an integrated circuit structure according to embodiments herein.
Figure 21:
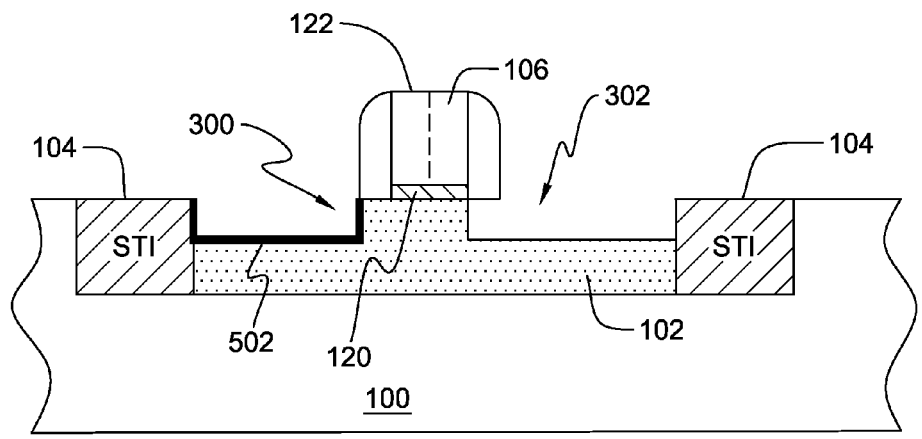
FIG. 21 is a schematic cross-sectional diagram of an integrated circuit structure according to embodiments herein.
Figure 22:
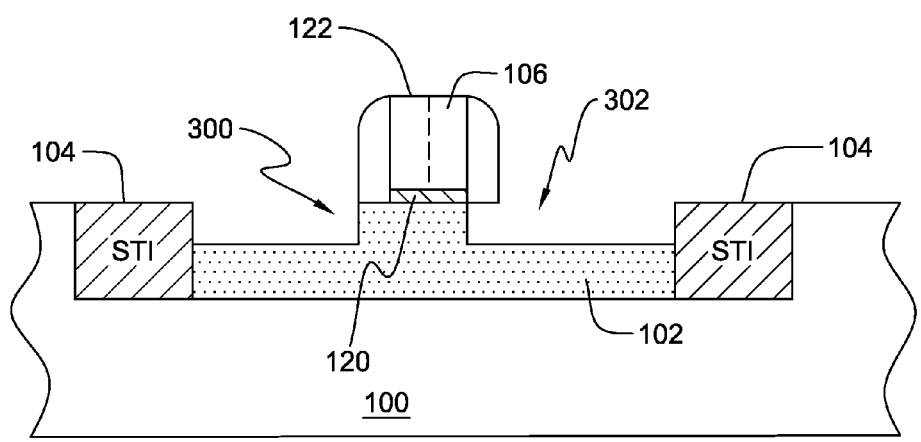
FIG. 22 is a schematic cross-sectional diagram of an integrated circuit structure according to embodiments herein.
Figure 23:
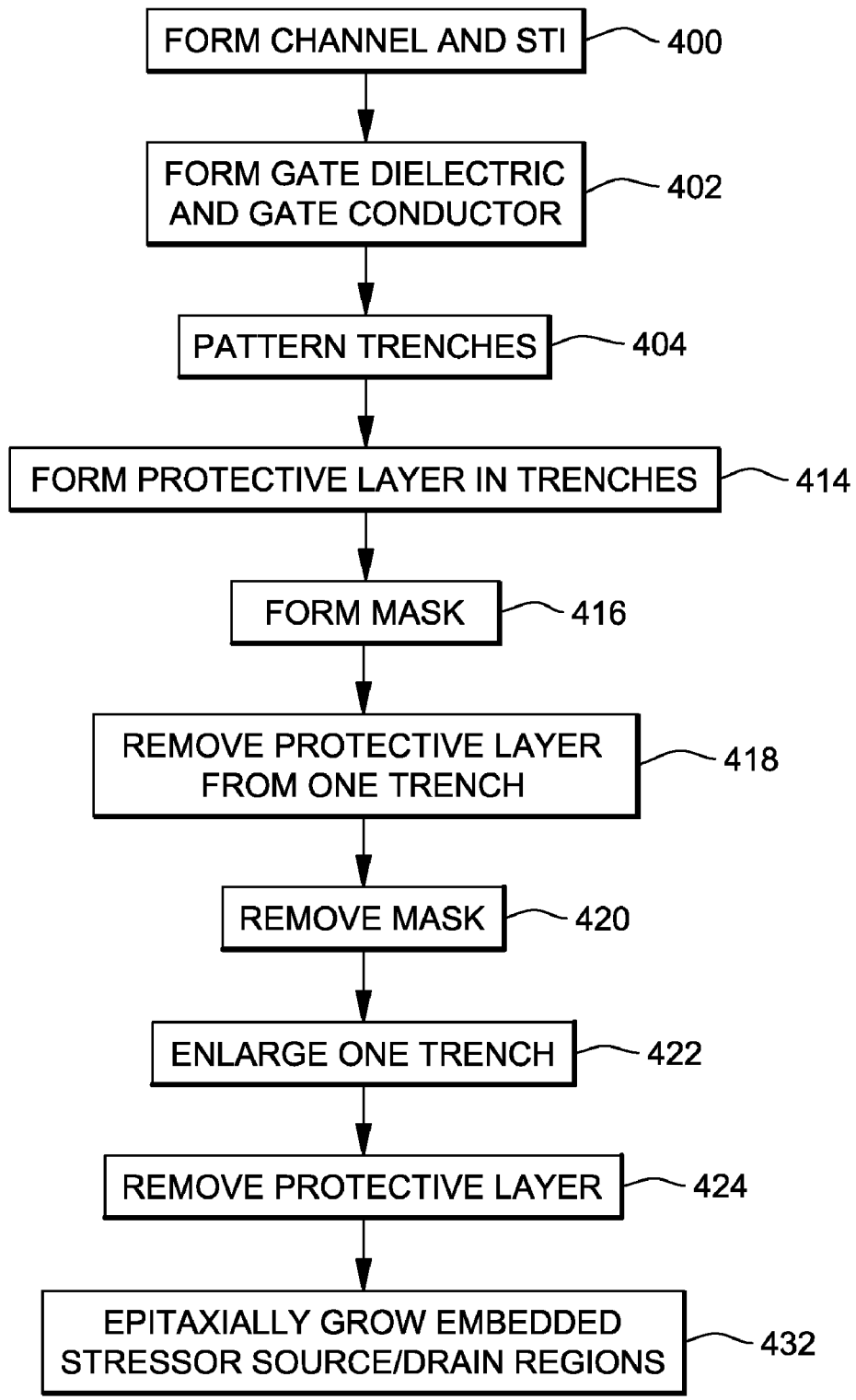
FIG. 23 is a flow diagram illustrating a method embodiment herein.

Alternatively, as shown in FIG. 18 a protective layer 502 (which can comprise an oxide, a nitride, or any other appropriate material) is formed within the trenches (item 414 in FIG. 23) and the mask 500 is again patterned over the structure (item 416 in FIG. 23). Again, FIG. 23 is similar to FIG. 13, discussed above, except for items 414-424 and a redundant discussion of such other items is not presented here. As shown in FIG. 19 and item 418, the protective layer is removed from one of the trenches (300). Then the mask 500 is removed as shown in FIG. 20 and item 420 in FIG. 23. In item 422 and FIG. 21, the method performs a material removal process to enlarge one of the trenches (trench 302). The other trench 300 is not affected by this material removal process because the protective layer 502 prevents material from being removed from trench 300. Then, as shown in FIG. 22 and item 424, the protective layer 502 is removed. Again, the epitaxial stressor source and drain regions can be grown (as shown in FIGS. 7 and 12 and item and 432, discussed above).

Therefore, as shown above, one of the concepts provided in this disclosure is to extend the device asymmetry to embedded eSiGe and eSiC stressors. The specific advantage of this novel structure varies depending upon the integration scheme. In an 'early stressor' integration scheme, in which the stressor is embedded into the source and drain regions before any doping profiles are created, the embodiments herein provide as much as 10% higher stress in the most critical regions of current flow as well as a stress distribution that is more aligned with the actual current flow in transistors. To the contrary, in a 'late' integration scheme, in which the halo/extension is implanted before the stressor deposition, it retains the advantage of enhanced stress profiles and also offers the opportunity of creating an asymmetrically doped device by removing more of the extension/halo implant on the drain side of the device.

The resulting integrated circuit chip can be distributed by the fabricator in raw wafer form (that is, as a single wafer that has multiple unpackaged chips) as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

What is claimed is:

1. A method comprising:

depositing impurities into a substrate to form at least one semiconductor channel region bordered by shallow trench isolation regions below an upper surface of said substrate;

forming a gate dielectric on said upper surface of said substrate over said semiconductor channel region;

patterning a gate conductor on said gate dielectric over said semiconductor channel region, said gate conductor having sidewalls;

forming sidewall spacers on said sidewalls of said gate conductor;

patterning trenches within said semiconductor channel region using said sidewall spacers as an alignment guide, said trenches comprising interior trench sidewalls immediately below said gate conductor and exterior trench sidewalls adjacent said shallow trench isolation regions;

performing an angled implant that implants a different amount of implanted material into a first interior trench sidewall on a first side of said gate conductor relative to a second interior trench sidewall on a second side of said gate conductor that is opposite said first side of said gate conductor;

performing a material removal process that removes material from said first interior trench sidewall at a different rate relative to said second interior trench sidewall because of said different amount of implanted material that is implanted into said first interior trench sidewall relative to said second interior trench sidewall, such that one of said trenches is positioned closer to a midpoint of said gate conductor relative to the other of said trenches regions, said trenches comprising asymmetric trenches; and epitaxially growing source and drain regions within said asymmetric trenches, one region of said source and drain regions being positioned closer to said midpoint of said gate conductor relative to the other region of said source and drain regions, and said source and drain regions comprising a material that induces physical stress upon said semiconductor channel region.

2. The method according to claim 1, said material removal process forming said trenches to have different sizes.

3. The method according to claim 1, said epitaxially growing of said source and drain regions forming said source and drain regions to have different sizes.

4. The method according to claim 1, said epitaxially growing of said source and drain regions comprising epitaxially growing one of silicon carbon or silicon germanium within said asymmetric trenches.

5. The method according to claim 1, said epitaxially growing of said source and drain regions forming said source and drain regions of a material that induces one of compressive stress and tensile stress upon said semiconductor channel region.

* * * * *